US006867632B2

United States Patent
Nitta et al.

(10) Patent No.: US 6,867,632 B2
(45) Date of Patent: Mar. 15, 2005

(54) SEMICONDUCTOR INTEGRATED CIRCUIT DEVICE

(75) Inventors: Yusuke Nitta, Tokyo (JP); Toshihiro Hattori, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/648,475

(22) Filed: Aug. 27, 2003

(65) Prior Publication Data

US 2004/0036518 A1 Feb. 26, 2004

Related U.S. Application Data

(63) Continuation of application No. 10/238,716, filed on Sep. 11, 2002, now Pat. No. 6,636,095, which is a division of application No. 09/861,600, filed on May 22, 2001, now Pat. No. 6,462,599, which is a continuation of application No. 09/209,006, filed on Dec. 11, 1998, now Pat. No. 6,246,277.

(30) Foreign Application Priority Data

Dec. 16, 1997 (JP) .............................................. 9-359275

(51) Int. Cl.⁷ .......................................... H03K 19/096
(52) U.S. Cl. ...................................... 327/292; 327/295
(58) Field of Search ................................ 327/292, 293, 327/294, 295, 564, 565; 326/93

(56) References Cited

U.S. PATENT DOCUMENTS

| | | | |
|---|---|---|---|
| 4,420,696 A | 12/1983 | Gemma et al. | 327/239 |
| 5,043,792 A | 8/1991 | Adachi | 257/773 |
| 5,264,746 A | 11/1993 | Ohmae et al. | 326/93 |
| 5,376,842 A | 12/1994 | Honoa et al. | 327/293 |
| 5,430,397 A | 7/1995 | Itoh et al. | 326/101 |
| 5,497,109 A | 3/1996 | Honda et al. | 326/93 |
| 5,519,351 A | 5/1996 | Matsumoto | 327/295 |
| 5,537,498 A | 7/1996 | Bausman et al. | 327/293 |
| 5,691,662 A | 11/1997 | Soboleski et al. | 327/292 |
| 5,849,610 A | * 12/1998 | Zhu | 438/129 |
| 5,923,188 A | 7/1999 | Kametani et al. | 327/295 |
| 5,945,846 A | 8/1999 | Iwao et al. | 326/101 |
| 5,969,544 A | 10/1999 | Iwao et al. | 326/93 |
| 6,020,774 A | 2/2000 | Chiu et al. | 327/295 |
| 6,160,755 A | * 12/2000 | Norman et al. | 365/233 |
| 6,313,683 B1 | 11/2001 | Block et al. | 327/295 |

FOREIGN PATENT DOCUMENTS

| | | |
|---|---|---|
| JP | 8-274260 | 10/1996 |
| JP | 9-307069 | 11/1997 |

* cited by examiner

*Primary Examiner*—Tuan T. Lam
(74) *Attorney, Agent, or Firm*—Antonelli, Terry, Stout & Kraus, LLP

(57) ABSTRACT

A semiconductor integrated circuit device for minimizing clock skew over clock wiring shortened for reduced wiring delays. A plurality of stages of clock drivers are provided on clock wiring paths ranging from a clock generator to flip-flops. Clock lines connecting upper stage clock drivers are equalized in length in the form of a tree structure, and clock lines connecting lower stage clock drivers are made as short as possible.

11 Claims, 9 Drawing Sheets

SEMICONDUCTOR INTEGRATED CIRCUIT DEVICE

CROSS-REFERENCE TO RELATED APPLICATIONS

This application is a Continuation application of application Ser. No. 10/238,716, now U.S. Pat. No. 6,636,095, filed Sep. 11, 2002, which is a Divisional of application Ser. No. 09/861,600, filed May 22, 2001, now U.S. Pat. No. 6,462,599 which is a Continuation of Ser. No. 09/209,006, filed Dec. 11, 1998, now U.S. Pat. No. 6,246,277, the entire disclosure of which is hereby incorporated by reference.

BACKGROUND OF THE INVENTION

The present invention relates to a semiconductor integrated circuit device and, more particularly, to a semiconductor integrated circuit device having clock wiring with reduced clock skew.

Some semiconductor integrated circuit devices, such as VLSIs, include a synchronous circuit having flip-flops driven by a common clock signal. To make such a synchronous circuit operate more rapidly, these semiconductor integrated circuit devices require that clock skew (i.e., differences in clock supply timing between flip-flops) be minimized for removal of signal-to-signal timing differences.

Various layout design techniques for reducing such clock skew have been proposed. One such technique involves installing tree-structure paths between a clock signal generator and a plurality of flip-flops, wherein the length of the path between the generator and each flip-flop is suitably adjusted. Another technique, which is disclosed in Japanese Published Unexamined Patent Application No. Hei 9-307069, requires inserting clock buffers where appropriate when tree-structure wiring has been established, whereby the tree structure is readjusted so that the difference between a maximum and a minimum of delays on the readjusted wiring attains a predetermined value. Where there still remains clock skew despite the provision of tree structure wiring, another technique disclosed in Japanese Published Unexamined Patent Application No. Hei 8-274260 seeks to minimize the skew by replacing appropriate drivers with small-capacity drivers so that the paths with maximum skew become equal in skew level to other tree branch paths between second stage clock drivers and block circuits.

The conventional techniques outlined above have failed to consider optimum arrangements of skew reduction for VLSIs. These techniques presuppose that on tree-structure paths between a clock generator and each flip-flop, each node is afforded wiring of an equal length. If equal-length wiring is provided ranging from a clock generator through a plurality of stages of drivers to flip-flops, alternative lines necessitated by the equal-length lines at all stages prolong the overall clock wiring. The resulting disadvantages include more delays of clock signals and higher power dissipation.

Furthermore, the conventional techniques above have disregarded an optimum clock layout for each of the functional portions or for each of a plurality of clock phases in connection with LSIs. A VLSI comprises random logic circuits and data paths reflecting various functions of the device, as well as numerous I/O pads. The conventional techniques have so far shied away from providing any optimum clock layout for the diverse internal arrangements of the LSI.

SUMMARY OF THE INVENTION

It is therefore an object of the present invention to provide a semiconductor integrated circuit device having a clock skew-lowering layout that ensures reduced wiring delays, enhanced packaging density and low clock power dissipation.

It is another object of the present invention to provide a semiconductor integrated circuit device having an optimum clock layout corresponding to each of the functional portions constituting an LSI.

These and other objects, features and advantages of the invention will become more apparent upon a reading of the following description and appended drawings.

Major features and benefits of the invention are outlined below. In carrying out the invention, and according to one aspect thereof, there is provided a semiconductor integrated circuit device comprising a plurality of stages of clock drivers furnished on clock wiring paths ranging from a clock generator to flip-flops. Clock lines connecting upper stage clock drivers have an equal length each in the form of a tree structure, and clock lines connecting lower stage clock drivers have the shortest possible lengths.

The lower the stage, the greater the number of clock drivers furnished. In that structure, clock lines connecting lower stage clock drivers are made to have not equal lengths but the shortest possible lengths. The arrangement shortens the overall clock wiring, reduces wiring delays, enhances packaging density, and lowers clock power dissipation. Since the lower stage clock drivers are connected by lines that are shorter than those connecting the upper stage clock drivers, the lower stage clock drivers may have the shortest possible wiring entailing negligible clock skew. Because the upper stage clock drivers are connected by extended wiring, the lines constituting such wiring are made to be equal in length in order to minimize clock skew.

A semiconductor integrated circuit device according to another aspect of the invention also comprises a plurality of stages of clock drivers. Of these drivers, intermediate stage clock drivers are provided with clock logic circuits for controlling clock signal supply.

The clock logic circuits control the supply of clock signals to individual function blocks corresponding to the intermediate clock drivers in question. The setup implements a clock signal supply scheme suitable for a VLSI while minimizing clock skew. Preferably, next-to-last stage clock drivers may have clock logic circuits for supply of clock signals to the flip-flops of random logic circuits and input/output pads, and both last stage and next-to-last stage clock drivers may have clock logic circuits for the supply of clock signals to the flip-flops of data paths.

DETAILED DESCRIPTION OF THE EMBODIMENTS

Figure 1:
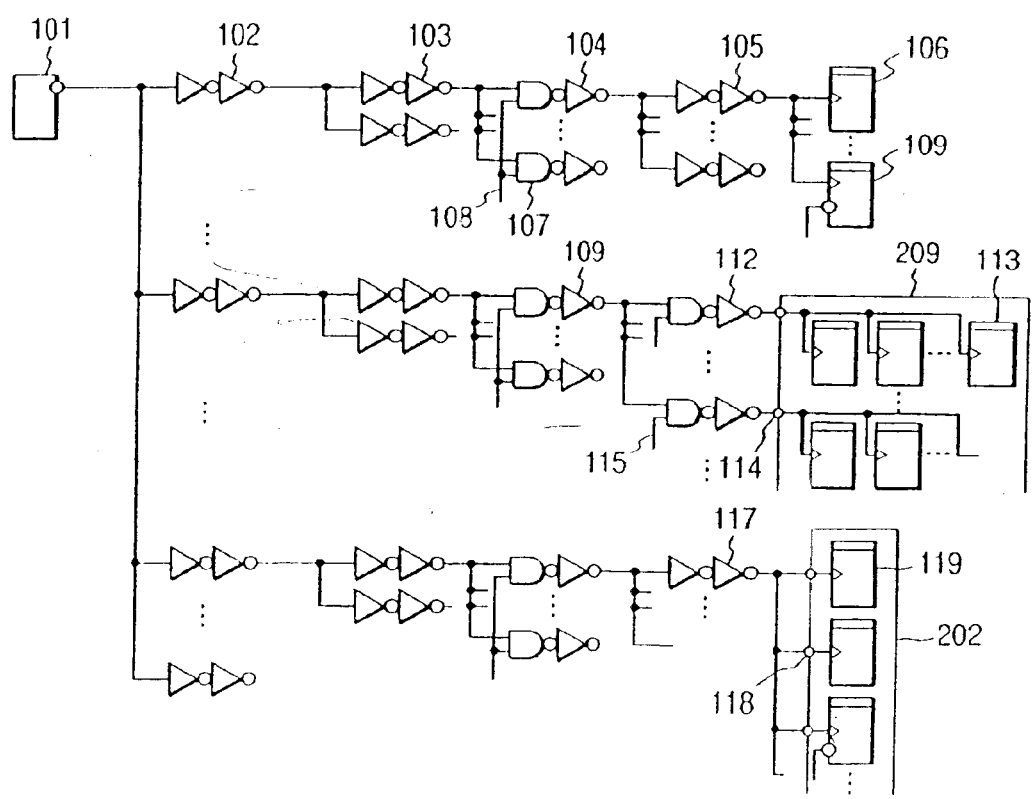
FIG. 1 is a schematic circuit diagram of clock logic circuits applicable to a semiconductor integrated circuit device embodying the invention.

FIG. 1 is a schematic diagram showing clock logic circuits applicable to a semiconductor integrated circuit device embodying the invention. This embodiment comprises four stages of clock drivers through which a clock signal generator 101 supplies clock signals to all flip-flops 106 inside the chip. The flip-flops are located in random logic circuits, data paths, and input/output pads.

The clock drivers at each stage play the roles described below. Clock drivers 102, situated at the first stage as viewed from the clock signal generator, are called root clock drivers. These drivers distribute throughout the entire chip the clock signals output by the clock signal generator.

Second stage clock drivers 103 distribute clock signals to third stage clock drivers 104. The drivers 104 are located in regions each made up of a number of logic blocks in the chip.

The third stage clock drivers 104 and fourth stage clock drivers 105 serve to distribute clock signals to all flip-flops in the logic blocks. If the third stage clock drivers 104 are constituted logically to control the supply of clock signals, it is possible to control clock signal supplies on a block-by-block basis.

Each third stage clock driver 104 supplies clock signals to a group of fourth stage clock drivers 105 distributed in each of the logic blocks. The fourth stage clock drivers 105 supply clock signals directly to the flip-flops 106. Each driver 105 feeds clock signals to a group of flip-flops 106 distributed in the logic blocks of random logic circuits. Each data path 209 supplies clock signals to a column of flip-flops 113 via a clock terminal 114. Each I/P pad portion 202 feeds clock signals to flip-flops 119 within a predetermined distance by means of clock terminals 118.

The third stage clock drivers 104 are provided as AND circuits each having a control signal input terminal 107. All third stage clock drivers 104 inside each of the logic blocks are connected to a signal line 108 that controls the supply of clock signals within the block in question. With the third stage clock drivers 104 provided as AND circuits, there is no need to provide each fourth stage clock driver 105 as an AND circuit. This minimizes the number of clock drivers that need to be replaced by AND circuits. A reduction in the number of clock drivers replaced by AND circuits directly translates into a reduction in the lengths of the control signal lines.

Figure 3:
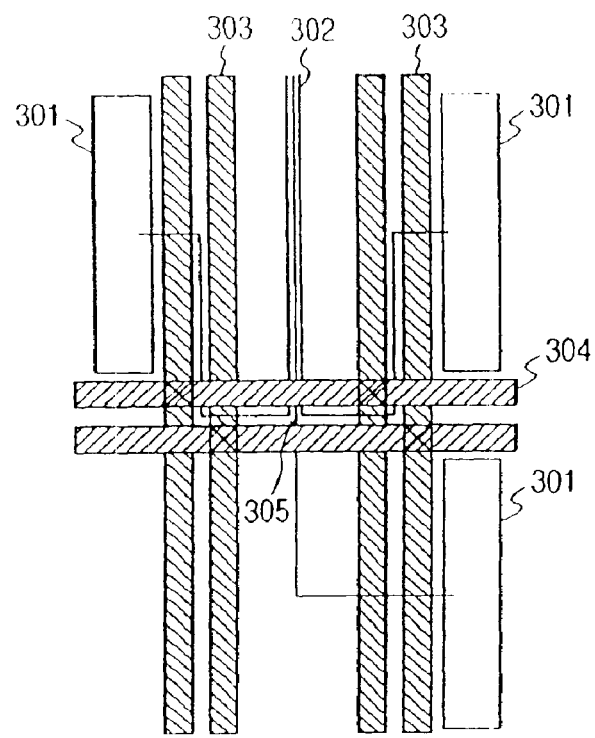
FIG. 3 is a detailed plan view of the layout of a region 204 in FIG. 2.

The concept sketched in FIG. 1 is not limited to a single-phase clock scheme; it is obviously applicable to multi-phase clock arrangements as well. The semiconductor integrated circuit device of this embodiment includes three lines 302 coming from the clock signal generator and implementing a three-phase clock scheme, as shown in FIG. 3. The three-phase clock scheme generates three kinds of clock signal: a first clock signal, the fastest clock signal fed to a CPU and an FPU in the semiconductor integrated circuit device; a second clock signal supplied to bus access controllers such as a DMAC (direct memory access controller) and I/O pads; and a third clock signal fed to peripheral controllers. In FIG. 3, three root clock driver layout regions 301 are furnished to match the three clock signals of the three-phase clock scheme. For purpose of explanation, FIG. 1 indicates in unified fashion the three kinds of clock signal: one clock signal fed to the flip-flops (106, 109) of the random logic circuits; another clock signal supplied to the flip-flops (113) of the data paths; and another clock signal fed to the flip-flops (119) of the I/O pads. Of the three-phase clock signals, the first clock signal is sent to the random logic circuits and data paths, the second clock signal is given to the random logic circuits and I/O pads, and the third clock signal is delivered to the random logic circuits.

Some flip-flops admit control signals, while others do not. The random logic circuits and I/O pads contain both types of flip-flops. The data paths 209 have no flip-flops admitting control signals. Instead, all flip-flops arranged in each single column are controlled collectively by a clock driver 112 that serves as an AND circuit having a control signal input terminal 115. Where control signals are input to the last stage clock drivers 112 on the data paths, the flip-flops inside the data paths have no need for control terminals. This structure enhances the packaging density of the embodiment.

A low clock skew state is brought about by unifying differences in arrival time between clock signals sent from the clock signal generator 101 to all flip-flops (called clock delays hereunder). To unify the clock delays requires adjusting both the driving force of clock drivers and the load capacities associated with the clock drivers. The load capacity of a clock driver is determined by the total sum of the capacity of a line connected to the driver in question and the capacity of the input terminal of a fan-out destination cell. In the logic setup of this embodiment, the driving forces of the clock drivers at each stage and the load capacities associated therewith are adjusted so as to unify the clock delays involved, thereby harmonizing all clock delays. The clock drivers 102 and 103 use cells of the same type throughout all paths, each driver having an identical fan-out count and an equal wiring length. The clock drivers 104 and 105 have different fan-out counts at each stage but share the same total capacity including wiring capacity, with the exception of the clock drivers 112 on the data paths. For example, if fan-out destination clock drivers are far away so that the wiring involved is necessarily long, the fan-out count tends to be small. Conversely, if clock drivers are nearby, the fan-out count is likely to be large. Each clock driver 112 on a data path has up to 32 flip-flops 113 within the path. Thus the clock drivers 112 have greater capacities than the clock drivers of the random logic circuits. For that reason, clock drivers with high driving forces are used at the last stage to harmonize the clock delays with those of the random logic circuits and I/O pads. Thanks to the above-described four-stage clock logic arrangement over all paths, clock delays may be adjusted at each stage.

Where multi-phase clock signals are used, similar logical structures are instituted. Because all phases are matched with like logical structures, there occurs little key skew between the multi-phase clock signals.

Figure 2:
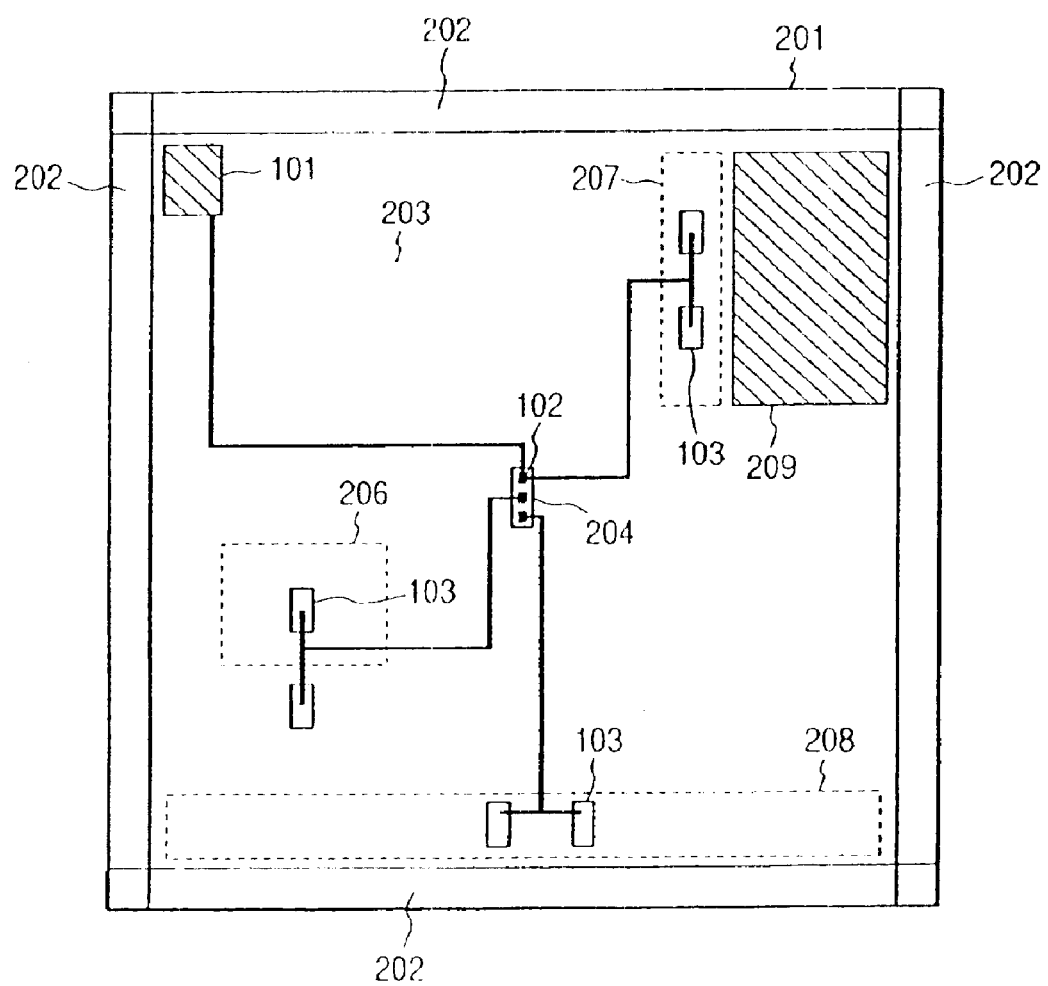
FIG. 2 is a top view of a clock layout on a chip carrying the semiconductor integrated circuit device embodying the invention.

FIG. 2 shows a clock layout on a chip 201 carrying the semiconductor integrated circuit device embodying the invention. In FIG. 2, the clock signal generator 101 is located in a corner of the chip 201 and adjacent to an I/O pad portion 202.

All clock drivers are furnished in a cell layout region 203. The root clock drivers 102 are gathered together in a region 204 near the chip center. The clock signal generator 101, which is vulnerable to adverse effects from other circuits, is located peripherally in the chip. The root clock driver 102 located centrally in the chip extends clock wiring to the downstream root clock driver. This setup ensures stable supply of clock signals and makes it easier to minimize clock skew.

Some second stage clock drivers 103 are allocated to a region 206 that comprises a number of logic blocks. Second stage clock drivers 103 assigned to the data path 209 are located in a clock driver layout region 207 on the clock terminal side of the data paths. Likewise, second stage clock drivers 103 destined for the I/O pad portions 202 are furnished in a clock driver layout region 208 on the clock terminal side of each pad.

FIG. 3 depicts in detail the layout of the region 204 in FIG. 2. As mentioned earlier, what FIG. 3 portrays is a three-phase clock layout. The root clock drivers 102 are gathered together in regions 301 that are each adjacent to a power supply line 303. Reference numeral 302 denotes signal lines coming from the clock signal generator.

In this multi-phase setup, the root clock drivers 102 for each clock phase flank a vertical power supply line 303 and a horizontal power supply line 304. The clock lines 302 leading to the clock driver layout regions 301 for all clock phases run in parallel up to a point 305 where the lines are branched, the point 305 being at an equal distance from all clock driver layout regions. Because the clock driver layout regions are not concentrated on a single power supply line, the supply of power is stabilized. The wiring arrangement above makes the line lengths substantially equal for all phases between the clock signal generator 101 and each of the root clock drivers 102.

Figure 4:
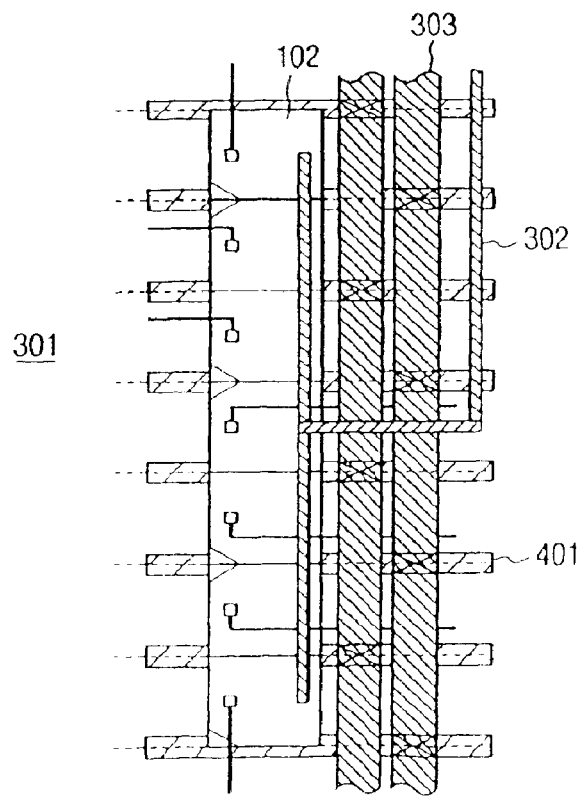
FIG. 4 is a more detailed plan view of the vicinity of a region 301 in FIG. 3.

FIG. 4 provides a more detailed view of the vicinity of one region 301 in FIG. 3. As illustrated, the root clock drivers 102 in the region 301 are arranged adjacent to one another in the vertical direction. There is no other cell interposed between each root clock driver 102 and the power supply line 303. With the root clock drivers 102 gathered near the chip center, the lines ranging from the clock signal generator to all root clock drivers 102 are made equal in length. Because the maximum distance between the root clock drivers 102 and the second stage clock drivers 103 is reduced, clock delays are lowered correspondingly. Where the regions 301 are located adjacent to the power supply lines, it is possible to supply power in a stable manner to the regions where a plurality of root clock drivers 102 are gathered together.

Figure 5:
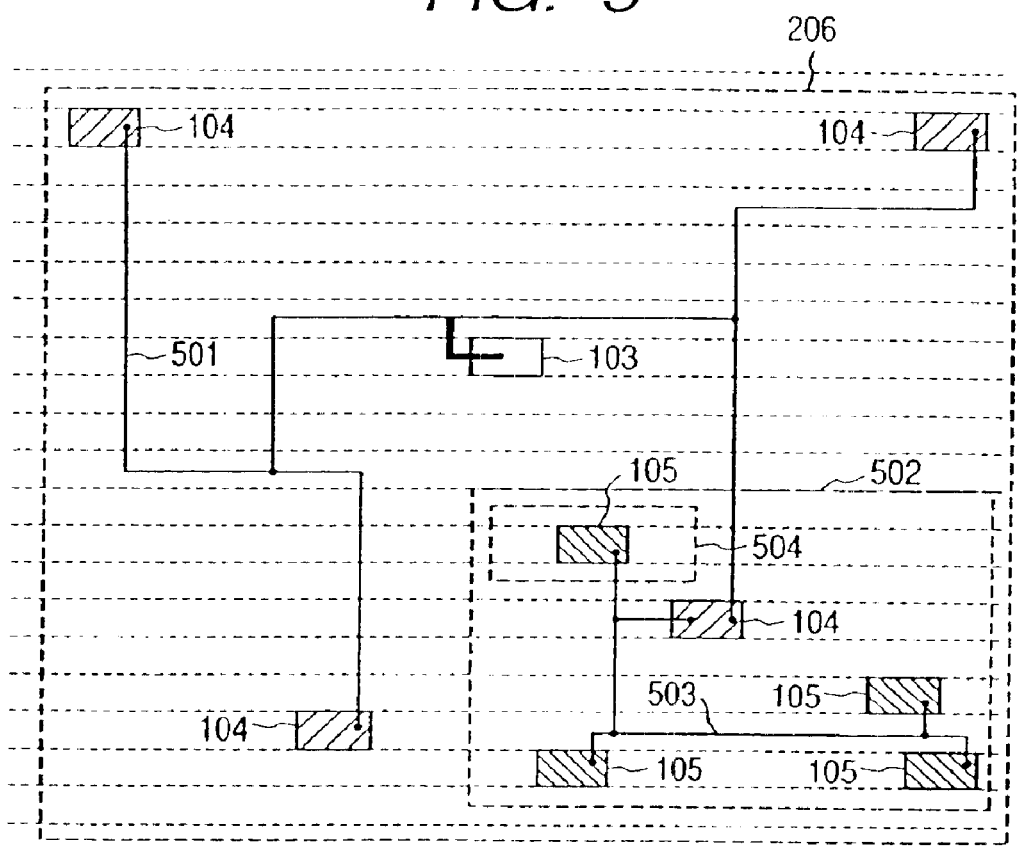
FIG. 5 is a detailed plan view of the layout of a region 206 in FIG. 2.

FIG. 5 gives a detailed view of the layout of the region 206 in FIG. 2. The second stage clock driver 103 in the region 206 is located near the center of gravity of a plurality of third stage clock drivers 104 distributed within the same region. Lines making up a network 501 ranging from the second stage clock driver 103 to the third stage clock drivers 104 are equalized in length.

Each third stage clock driver 104 is allocated to a region 502 wherein fourth stage clock drivers 105 are gathered adjacent to one another. Lines constituting a network 503 ranging from the third stage clock driver 104 to the fourth stage clock drivers 105 are equalized in length.

Figure 6:
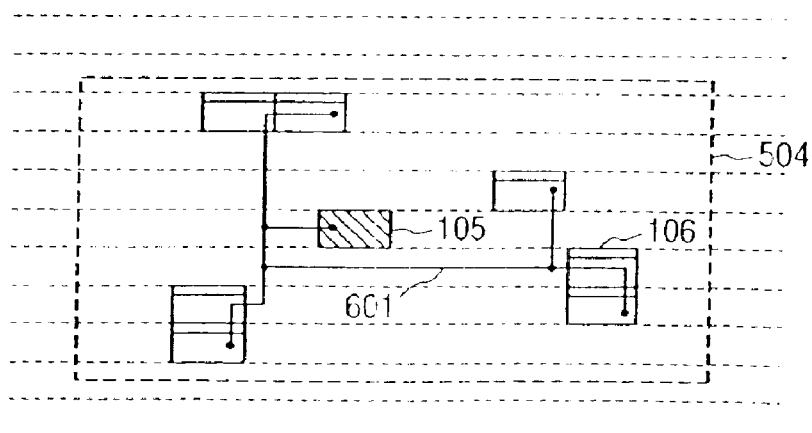
FIG. 6 is a more detailed plan view of the layout of a region 504 in FIG. 5.

FIG. 6 gives a more detailed view of the layout of a region 504 in FIG. 5. As illustrated, each fourth stage clock driver 105 is allocated to the region 504 wherein flip-flops 106 are gathered adjacent to one another. Lines making up a network 601 ranging from the fourth stage clock driver 105 to the flip-flops 106 are equalized in length.

Figure 7:
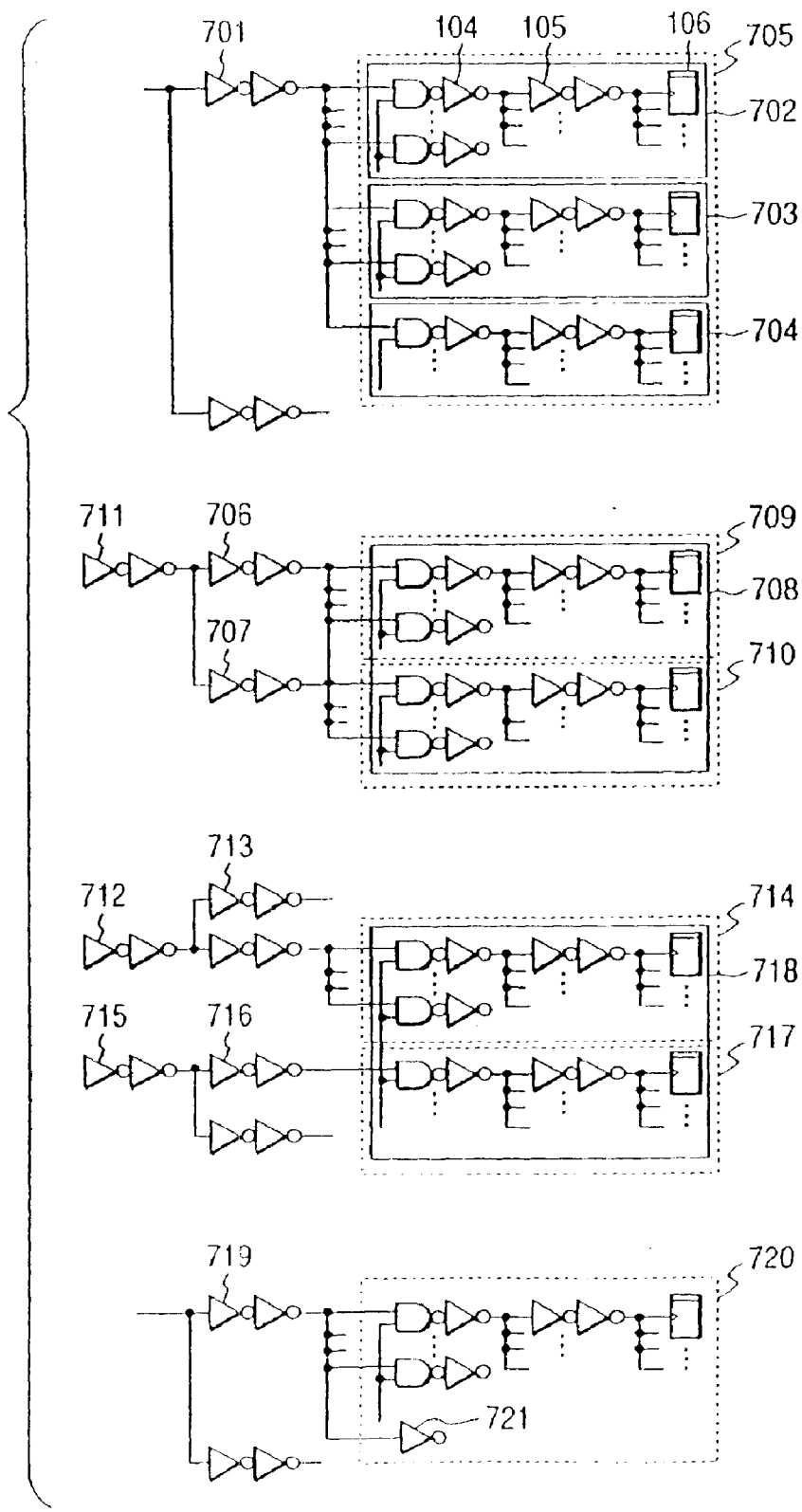
FIG. 7 is a set of schematic views depicting relations between clock drivers at different stages on the one hand and logic blocks on the other hand in the inventive semiconductor integrated circuit device.

FIG. 7 provides a set of schematic views depicting relations between clock drivers at different stages on the one hand and logic blocks on the other hand in the inventive semiconductor integrated circuit device. Each of the regions 206 comprises either a plurality of logic blocks or part of a logic block. Logic blocks wherein the number of third stage clock drivers 104 is smaller than a reference fan-out count of the second stage clock driver 103 are gathered together; logic blocks wherein the number of third stage clock drivers 104 is larger than the reference fan-out count are each divided into smaller regions.

Illustratively, logic blocks 702, 703 and 704 wherein the number of third stage clock drivers 104 is smaller than the reference fan-out count are gathered together in a region 705 handled by a second stage clock driver 701. On the other hand, a logic block 708 in which the number of third stage clock drivers 104 is larger than the reference fan-out count is divided into regions 709 and 710. The region 709 is handled by a second stage clock driver 706, and the region 710 is dealt with by a second stage clock driver 707. Reference numeral 711 in this setup denotes a root clock driver.

However, it is not desirable to establish a logical structure such as one of a region 718 that is divided into regions 714 and 717, the region 714 being handled by a second stage clock driver 713 connected to a root clock driver 712, the region 717 being dealt with by a second stage clock driver 716 coupled to another root clock driver 715. This type of logical structure will give rise to a possibility that a single logic block can be subject to adverse effects of the clock skew over relatively long wiring between the clock signal generator and the root clock drivers.

Where the number of clock drivers is smaller than the reference fan-out count inside a region 720 handled by a second stage clock driver 719, dummy cells 721 are added to the region to compensate for the shortage of clock drivers. A dummy cell is a cell of which the input capacity is the same as that of a clock driver connected to the same network and which does not use output signals of the network.

As described, the fan-out count of the second clock driver 103 may be taken as the reference value with respect to which adjustments are made as needed. This makes it possible to harmonize on all paths the clock delays stemming from the second clock drivers 103.

Figure 8:
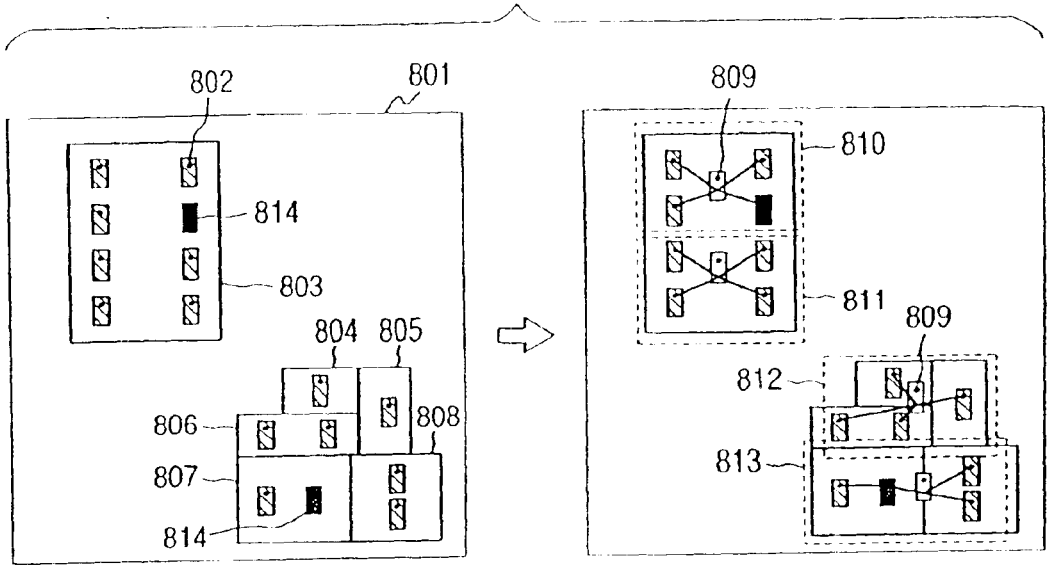
FIG. 8 is a set of layout diagrams illustrating relations between the regions handled by the second stage clock drivers shown in FIG. 7 on the one hand and logic blocks on the other hand.

FIG. 8 provides a set of layout diagrams illustrating relations between the regions handled by the second stage clock drivers shown in FIG. 7 on the one hand and logic blocks on the other hand. Illustratively, if the reference fan-out count of a second stage clock driver 809 is 4, then a logic block 803, in which the number of third stage clock drivers 802 is greater than the reference fan-out count, is divided into regions 810 and 811. Third stage clock drivers in each of the regions 810 and 811 are assigned a second stage clock driver 809. How to divide a logic block is determined by the arrangement of third stage clock drivers 802 furnished therein. If the clock driver count in a divided region is smaller than the reference fan-out count, then previously furnished dummy cells 814 are used to take the place of third stage clock drivers 802 to compensate for the shortage of clock drivers. Meanwhile, each of logic blocks 804, 805, 806, 807 and 808 has a smaller number of third stage clock drivers 802 than the reference fan-out count. In such cases, adjacent logic blocks are gathered together to form a single region to which a second stage clock driver 809 is allocated.

In FIG. 8, the logic blocks 804, 805 and 806 are combined into a region 812, and the logic blocks 807 and 808 into a region 813. Where the number of third stage clock drivers 802 is smaller than the reference fan-out count inside a combined region, previously furnished dummy cells 814 are utilized to compensate for the shortage with respect to the fan-out count of the second stage clock driver 809.

Figure 9:
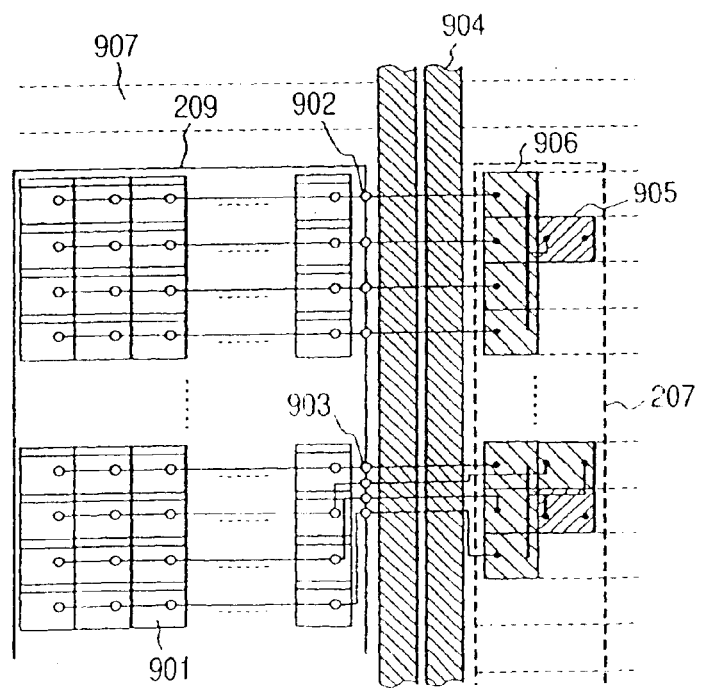
FIG. 9 is a detailed plan view of clock drivers laid out in data paths.

FIG. 9 is a detailed view of clock drivers laid out in data paths 209 shown in FIG. 2. A clock terminal 902 is allocated to each column of flip-flops 901 in the data paths 209. The clock terminals 902 are arranged so as to line up on one side of the data paths 209.

A clock driver layout region 207 is provided on a cell layout region 907 on the side of the clock terminals 902 for the data paths. Inside the clock driver layout region 207 are third stage clock drivers 905 and fourth stage clock drivers 906.

The clock driver layout region 207 is also arranged to be adjacent to a power supply line 904. If clock drivers of the data paths are located on the cell layout region, it is possible to gather clock drivers together where the clock terminals are concentrated. This helps prevent a surge in clock delays. Providing the clock driver layout region forestalls increases of distances up to the clock drivers. Although the clock drivers of the data paths are considerably concentrated in terms of layout because of their numerous clock terminals, locating the clock driver layout region adjacent to the power supply line ensures stable supply of power.

Although not shown, there exist a large number of third stage clock drivers 905 of the data paths. In this setup, the wiring between the second stage clock drivers 103 and the third stage clock drivers 905 of the data paths is furnished as follows: a plurality of third stage clock drivers are grouped together, and the wiring within that group is made as short as possible. Lines between the second stage clock drivers 103 and the respective groups of third stage clock drivers are equalized in length.

Figure 10:
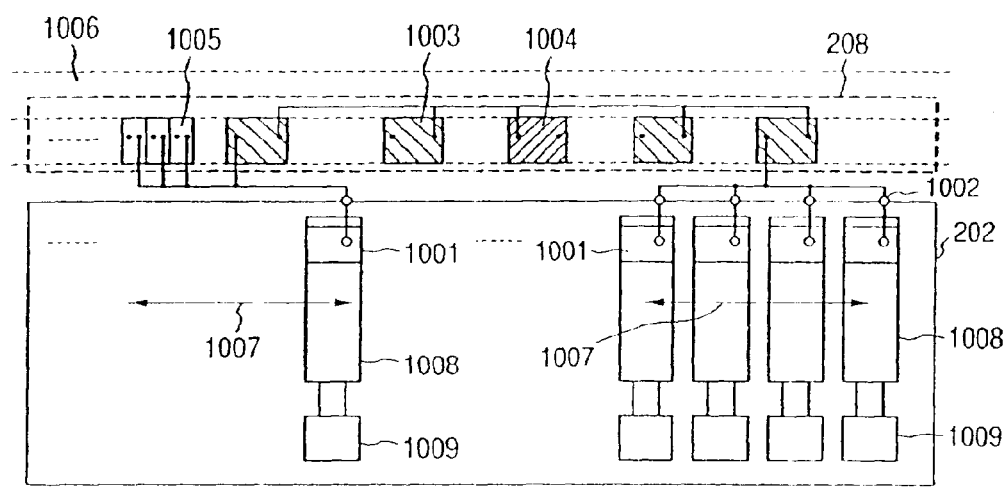
FIG. 10 is a detailed plan view of clock drivers laid out in an input/output pad.

FIG. 10 provides a detailed view of clock drivers laid out in the I/O pad portion 202 shown in FIG. 2. A clock terminal 1002 is allocated to each flip-flop 1001 inside the I/O pad portion 202. The clock terminals 1002 are arranged so as to line up on one side of the I/O pad portion 202. A clock driver layout region 208 is furnished on a cell layout region 1006 on the side of the clock terminals 1002 in the I/O pad portion 202. Inside the clock driver layout region 208 are third and fourth stage clock drivers 1004 and 1003 arranged in a row, each third stage clock driver being flanked by a plurality of fourth stage clock drivers. A reference wiring length is set for the fourth stage clock drivers 1003, and as many clock terminals 1002 as a reference fan-out count are allocated within the reference wiring length. This arrangement is adopted here because the number of clock terminals are small despite the long distance occupied by them in the I/O pad portion 202.

If there are fewer clock terminals within the reference wiring length 1007 than the reference fan-out count, then dummy cells 1005 are added to compensate for the shortage.

When the layout regions are furnished as described, any increases in the distances up to the clock drivers are substantially prevented. The use of numerous dummy cells makes it possible to harmonize clock delays despite the presence of sparsely arranged clock terminals.

The dummy cells 1005 should preferably be arranged in the same row as that of a plurality of clock drivers as illustrated in FIG. 10. That is because the arrangement facilitates adjustment of the wiring lengths while minimizing increases in occupied areas.

In FIG. 10, one fourth stage clock driver 1003 is furnished corresponding to four clock terminals. However, the one-to-four correspondence is not limitative of the invention. For example, suppose that each fourth stage clock driver 1003 is assigned 12 terminals and that only one flip-flop 1001 is connected to a fourth stage clock driver 1003. In that case, 11 dummy cells 1005 may be connected to the fourth stage clock driver 1003 in question.

In the I/O pad portion 202, each flip-flop 1001 is associated with an input/output circuit 1008 and an I/O pad 1009 which are arranged in the direction of a chip edge. In the inventive semiconductor integrated circuit device, the logic circuits inside of the I/O pad portions 202 use signals with an amplitude of 1.8 V, and are interfaced to signals with an amplitude of 3.3 V from outside the chip. The interface capability is implemented by use of a level shifter circuit arrangement. More specifically, each I/O circuit 1008 includes a three-state logic circuit, a level shifter circuit and an I/O buffer circuit arranged in that order starting from the flip-flop side. These circuits are connected to an I/O pad 1009.

Figure 11:
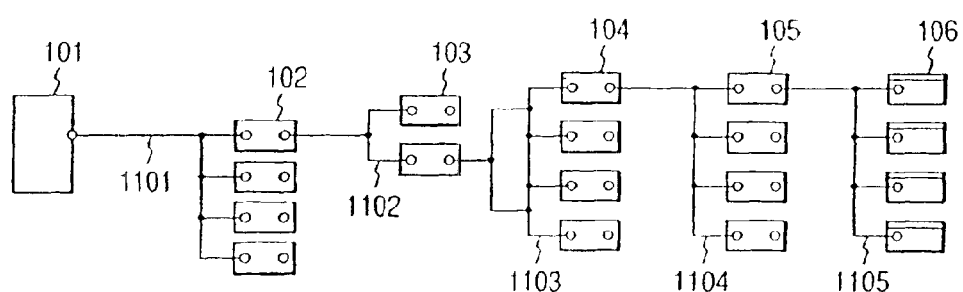
FIG. 11 is a conceptual diagram showing how different stages of the inventive semiconductor integrated circuit device are typically wired.

FIG. 11 gives a conceptual view illustrating how different stages of the inventive semiconductor integrated circuit device are typically wired. Lines 1102 and 1103 are equalized in length and constitute a binary tree structure. Lines 1104 and 1105 are made as short as possible. That is, the lines at a higher stage where fan-out destination cells are distributed extensively are equalized in length; wiring at a lower stage where fan-out destination cells are narrowly distributed is made the shortest possible wiring. Length differences (i.e., between a maximum and a minimum length) between clock lines equalized in length are smaller than length differences between clock lines that are made as short as possible.

Wiring 1101 is provided at the highest stage. However, since this wiring involves root clock drivers 102 gathered together as shown in FIG. 4, it is prepared as the shortest possible wiring.

The lines 1102 and 1103, with their fan-out destination cells distributed extensively, are equalized in length on all paths. This arrangement helps harmonize clock delays over the paths.

The above adjustments are made possible because the number of clock drivers at the upper stages is limited. The lower the stage, the greater the number of clock drivers installed. Thus the lines are made as short as possible at lower stages in order to reduce the overall wiring length, boost packaging density and minimize line-induced delays. Because the wiring is shorter at lower stages, clock skew stemming from the line-induced delays is negligible there.

At higher stages where extended wiring promotes vulnerability to delays, the lines involved are equalized in length so as to reduce the clock skew caused by the line-induced delays. When all lines are equalized in length on all paths, differences in load capacity between clock drivers are eliminated.

Figure 12:
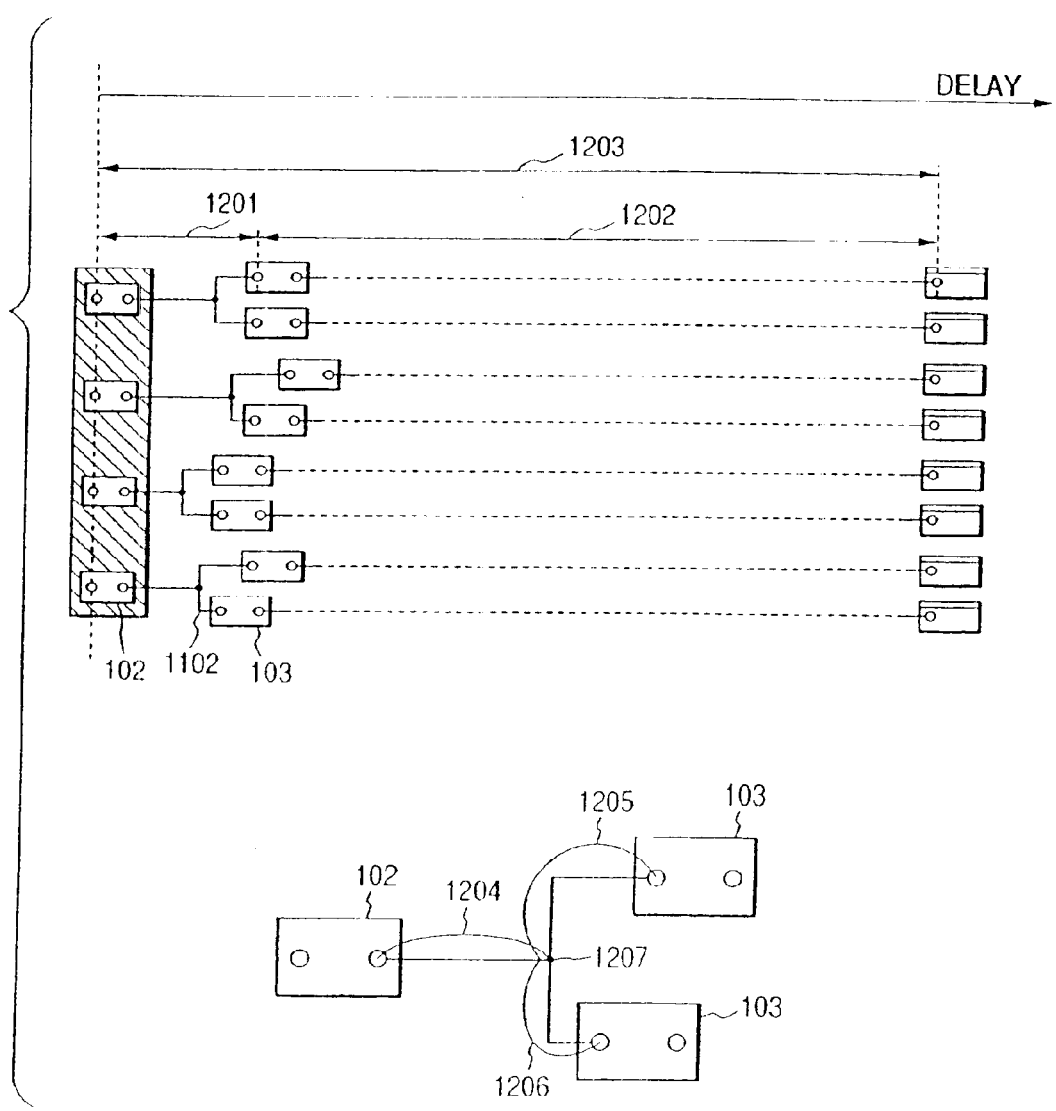
FIG. 12 is a set of explanatory diagrams indicating how differences between clock delays are reduced over different paths by use of clock wiring 1102.
Figure 13:
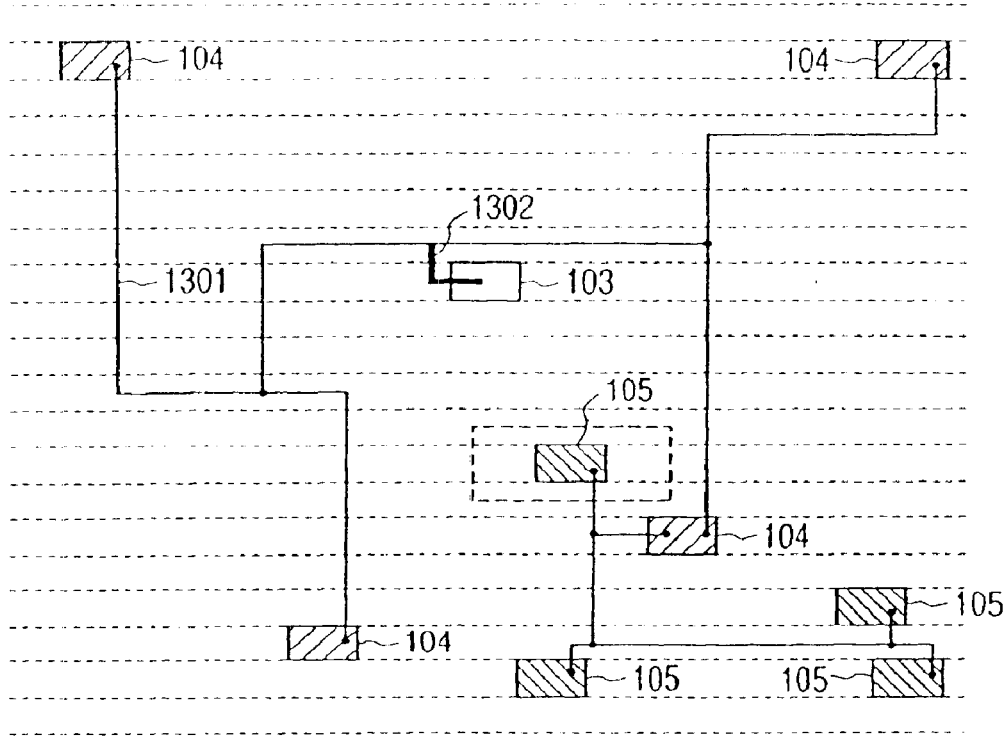
FIG. 13 is a schematic view depicting typical clock wiring ranging from second stage clock drivers to third stage clock drivers.
Figure 14:
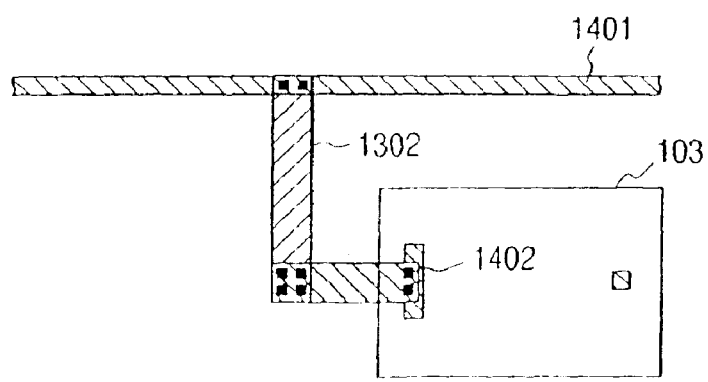
FIG. 14 is a partially enlarged view of the clock wiring from the second stage clock drivers to the third stage clock drivers in FIG. 13.

FIG. 12 offers a set of explanatory views indicating how differences between clock delays are reduced over different paths by use of the clock wiring 1102. It may happen that differences in clock delay 1202 exist between second stage clock drivers 103 and flip-flops 106. Such differences, if they occur, are reduced by modifying the configuration of the lines 1102 which are basically equalized in length and which constitute a binary tree structure. Specifically, clock delays 1201 are adjusted between the root clock drivers 102 and the second stage clock drivers 103. For example, if there are clock delay differences between each of two second stage clock drivers 103 connected to a line 1102 on the one hand and the corresponding flip-flops 106 on the other hand, the lengths of lines 1205 and 1206 between a junction 1207 and the second stage clock drivers 103 are adjusted at the point 1207 in such a manner that the clock delay differences are removed. Any clock delay differences that may occur between another root clock driver 102 and the second stage clock drivers 103 are eliminated by adjusting the length of a line 1204 between the clock driver 102 and the junction 1207. Such adjustments, which are relatively simply in procedure and are required at only a small number of locations, may be carried out manually.

Where clock drivers of high driving forces are used, lines wider than usual need to be employed to counter migration. Because the incidence of migration is proportional to the strength of current, the wiring need only be composed of wide lines up to first junctions beyond which the current strength is reduced by half. Along clock wiring 1301 between a second stage clock driver 103 and third stage clock drivers 104 in FIG. 13, a portion 1302 is made of a wide line (having twice the width of ordinary wiring) as shown in FIG. 14. The rest of the wiring has the ordinary width such as that of a portion 1401. An output terminal 1402 of each second stage clock driver 103 is shaped as a rectangle at least as broad as the wide line so that the latter may be connected properly to the terminal 1402. Where there are a limited number of locations requiring wide-line wiring, packaging density is improved.

Wide-line wiring is not limited to the clock wiring between the second stage clock drivers 103 and the third stage clock drivers 104. It is also possible to install wide lines up to the first junctions along the clock wiring between the root clock drivers 102 on the one hand and the second clock drivers 103 on the other hand.

As described, a semiconductor integrated circuit device having the inventive clock layout is subject to significantly reduced wiring delays, has increased packaging density, and provides a clock skew-lowering layout involving decreased clock power dissipation. The device also has an optimally arranged clock layout for each functional portion of the LSI.

As many apparently different embodiments of this invention may be made without departing from the spirit and scope thereof, it is to be understood that the invention is not limited to the specific embodiments thereof except as defined in the appended claims

What is claimed is:

1. A semiconductor integrated circuit device comprising:
 a plurality of flip-flops;
 a plurality of stages of clock drivers including ith ($1 \leq i \leq n$) stages to feed clock signals to the plurality of flip-flops; and
 a plurality of clock lines including ith ($2 \leq i \leq n$) clock lines to connect between a clock driver of an (i−1) th stage and clock drivers of an ith stage and (n+1) th clock lines to connect between a clock driver of an nth stage and the plurality of flip-flops,
 wherein differences between a maximum length and a minimum length of the ith clock lines are smaller than differences between a maximum length and a minimum length of the (n+1) th clock lines.

2. The semiconductor integrated circuit device according to claim 1, wherein the ith clock lines are equalized in length and the (n+1) th clock lines have a shortest possible length.

3. The semiconductor integrated circuit device according to claim 1, further comprising:
 a clock generator to generate clock signals having different phases,
 wherein plural clock drivers are provided for the first stage and first clock lines are provided to connect between the clock generator and the plural clock drivers of first stage, and
 wherein the plural clock drivers of the first stage are provided respectively for the clock signals having different phases.

4. The semiconductor integrated circuit device according to claim 3, wherein the clock generator is placed in a peripheral area of a chip and the plural clock drivers of first stage are placed in a center area of the chip.

5. The semiconductor integrated circuit device according to claim 3, further comprising:
 a circuit including the plurality of flip-flops; and
 a plurality of power lines to apply a supply voltage to the circuit,
 wherein clock drivers of the first stage are provided adjacent to different ones of said power lines.

6. The semiconductor integrated circuit device according to claim 1,
 wherein one of the ith clock lines has a first junction point, and
 wherein a width of the ith clock lines between a clock driver of the first stage and the first junction point is larger than a width of the ith clock line between the first junction point and clock driver of the second stage.

7. The semiconductor integrated circuit device according to claim 1,
 wherein a third clock line has a second junction point, and
 wherein a width of the third clock line between a clock driver of the second stage and the second junction point is larger than a width of the third clock line between the second junction point and a clock driver of the third stage.

8. A semiconductor integrated device comprising:
 a plurality of circuit blocks including at least a data pass and I/O circuit;
 a plurality of flip-flops included in the plurality of circuit blocks;
 a plurality of stages of clock drivers including an ith ($1 \leq i \leq n$) stage to feed clock signals to the plurality of flip-flops; and
 a plurality of clock lines including ith ($2 \leq i \leq n$) clock lines to connect between a clock driver of an (i−1) th stage and clock drivers of an ith stage and (n+1) th clock lines to connect between a clock driver of an nth stage and the plurality of flip-flops, wherein differences between a maximum length and a minimum length of the ith clock lines are smaller than differences between a maximum length and a minimum length of the (n+1) th clock lines.

9. The semiconductor integrated circuit device according to claim 8, further comprising:

a first area to provide clock drivers of nth and (n−1) th stages to feed clock signals to flip-flops of the data path, wherein the first area is adjacent to an area where the data pass is provided.

10. The semiconductor integrated circuit device according to claim 8, further comprising:

a power line to apply a supply voltage to the circuit blocks, wherein the first area is adjacent to the power lines.

11. The semiconductor integrated circuit device according to claim 8, further comprising:

a second area to provide clock drivers of nth and (n−1) th stages to feed clock signals to flip-flops of the I/O circuit;

wherein the second area is adjacent to an area where the I/O circuit is provided.

* * * * *